(12) United States Patent
Giles et al.

(10) Patent No.: US 7,867,861 B2
(45) Date of Patent: Jan. 11, 2011

(54) SEMICONDUCTOR DEVICE EMPLOYING PRECIPITATES FOR INCREASED CHANNEL STRESS

(75) Inventors: Luis-Felipe Giles, Munich (DE); Rainer Liebmann, Haar (DE); Chris Stapelmann, Tervuren (BE)

(73) Assignee: Infineon Technologies AG, Neubiberg (DE)

( * ) Notice: Subject to any disclaimer, the term of this patent is extended or adjusted under 35 U.S.C. 154(b) by 348 days.

(21) Appl. No.: 11/862,832

(22) Filed: Sep. 27, 2007

(65) Prior Publication Data

US 2009/0085110 A1 Apr. 2, 2009

(51) Int. Cl.
*H01L 29/94* (2006.01)
*H01L 21/8238* (2006.01)

(52) U.S. Cl. ............... 438/289; 438/783; 257/E29.345
(58) Field of Classification Search .................. 438/289, 438/783
See application file for complete search history.

(56) References Cited

U.S. PATENT DOCUMENTS

| | | | |
|---|---|---|---|
| 6,621,131 B2 | 9/2003 | Murthy et al. | |
| 6,885,084 B2 | 4/2005 | Murthy et al. | |
| 7,192,894 B2 | 3/2007 | Bu et al. | |
| 7,226,834 B2 | 6/2007 | Bu et al. | |
| 2004/0253791 A1 | 12/2004 | Sun et al. | |
| 2005/0184311 A1 | 8/2005 | Murthy et al. | |
| 2006/0081875 A1* | 4/2006 | Lin et al. ................. | 257/190 |
| 2006/0151832 A1 | 7/2006 | Murthy et al. | |
| 2009/0085110 A1* | 4/2009 | Giles et al. ................. | 257/335 |

* cited by examiner

*Primary Examiner*—Alexander G Ghyka
(74) *Attorney, Agent, or Firm*—Dicke, Billig & Czaja, PLLC

(57) ABSTRACT

A method for fabricating a semiconductor device including implanting a selected material at a desired target depth below a surface of a silicon substrate, performing an annealing process to create a band of precipitates formed from the selected material and the silicon of the silicon substrate at the desired target depth, and forming a source region and a drain region in the substrate such that a channel region there between is positioned above the band of precipitates, wherein the desired target depth is such that a desired separation distance is achieved between the channel region and the band of precipitates, and wherein an average lattice constant of the band of precipitates is different from the average lattice constant of the silicon substrate so as to cause a stress in the channel region.

5 Claims, 5 Drawing Sheets

SEMICONDUCTOR DEVICE EMPLOYING PRECIPITATES FOR INCREASED CHANNEL STRESS

BACKGROUND

Stress engineering techniques are employed to improve the performance of CMOS devices by applying a mechanical stress/strain to the channel region of FETs, with pFET devices requiring compressive stress and nFET devices requiring tensile stress. The applied stress enhances the mobility of the majority carriers (holes in pFET and electrons in nFET devices), enabling higher transistor drive currents and faster logic gate switching speeds.

Several techniques have been developed for applying the mechanical strain to the channel region of the FETs. One technique, which can create either tensile or compressive stress fields in the channel regions of CMOS devices, involves depositing nitride films at least over the gates covering the channel regions. However, only a fraction of the intrinsic film stress is transferred into the channel due the large distance between the nitride film and the channel. A second, more efficient technique is the so called embedded epitaxial silicon/germanium (eSi/Ge) technique. The expanding Si/Ge is formed in the source/drain regions very close to the channel. However, eSi/Ge is an expensive technique and, thus, is not well-suited for use with low-cost bulk planar CMOS.

A third technique for creating additional stress in the channel of MOSFET devices is the Stress Memory Technique (SMT). According to this technique, a first film with intrinsic stress is deposited over the device which, after thermal treatment, is removed. Due to not yet well understood processes, a portion of the exerted stress remains (i.e. is "memorized") in the device. Then a second etch stop liner (ESL) film with intrinsic stress is deposited and, thus, a higher stress can be achieved in the device than with the ESL film alone. However, although SMT works well for nFET devices, it does not work for pFET devices.

A fourth technique for straining the channel region is to use a hetero structure of different layers (e.g. SiGe and Si layers) to form the device channel. For example, a relaxed SiGe layer is grown on top of a recessed Si substrate using epitaxial growth. On top of this relaxed layer, a strained Si layer is deposited. The strain in the Si layer stems from a lattice constant mismatch between Si and SiGe. The epitaxial process used to create these structures is very slow and expensive and, thus, has not found use in mainstream semiconductor fabrication. Alternatively, the formation of SiC by implantation and solid phase epitaxial regrowth for embedded SiC has been proposed for source and drain regions.

References describing the above mentioned techniques include:

1. T. Mizuno et al., *Novel Anisotropic Strain Engineering on (110)-Surface SOI CMOS Devices using Combination of Local/Global Strain Techniques*, IEDM 2006;
2. K.-W. Ang et al., *Beneath-The-Channel Strain-Transfer-Structure (STS) and Embedded Source/Drain Stressors for Strain and Performance Enhancement of Nanoscale MOSFETs*, 2007 Symposium on VLSI Technology; and
3. Y. Liu et al., *Strained Si Channel MOSFETs with Embedded Silicon Carbon Formed by Solid Phase Epitaxy*, 2007 Symposium on VLSI Technology.

In view of the above, an improved method is needed for producing increased stress fields in MOSFETs.

SUMMARY

In one embodiment, a method is provided for fabricating a semiconductor device. The method includes implanting a selected material at a desired target depth below a surface of a silicon substrate, performing an annealing process to create a band of precipitates formed from the selected material and the silicon of the silicon substrate at the desired target depth, and forming a source region and a drain region in the substrate such that a channel region there between is positioned above the band of precipitates, wherein the desired target depth is such that a desired separation distance is achieved between the channel region and the band of precipitates, and wherein an average lattice constant of the band of precipitates is different from the average lattice constant of the silicon substrate so as to cause a stress in the channel region.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A semiconductor device employing a band of precipitates to produce stress in a channel region thereof and a method of fabricating the semiconductor device are described herein. According to one embodiment, the method includes implanting a selected material at a desired target depth below a surface of a silicon substrate. An annealing process is performed to create a band of precipitates formed from the selected material and the silicon of the silicon substrate at the desired target depth. A source region and a drain region are formed in the substrate such that a channel region there between is positioned above the band of precipitates, wherein the desired target depth is such that a desired separation distance is achieved between the channel region and the band of precipitates. An average lattice constant of the band of precipitates is different from the average lattice constant of the silicon substrate such that a stress is caused in the channel region.

In one embodiment, the semiconductor device is a PMOS semiconductor device and the selected material has properties such that the band of precipitates formed from the selected material and the silicon has an average lattice constant which is less than the average lattice constant of the silicon substrate so that the stress in the channel region comprises a compressive stress. For example, in one embodiment, the selected material comprises carbon such that the band of precipitates comprises a band of silicon-carbide precipitates.

Alternatively, in one embodiment, the semiconductor device is an NMOS semiconductor device and the selected material has properties such that the band of precipitates formed from the selected material and the silicon has an average lattice constant which is greater than the average lattice constant of the silicon substrate so that the stress in the channel region comprises a tensile stress.

Figure 1:
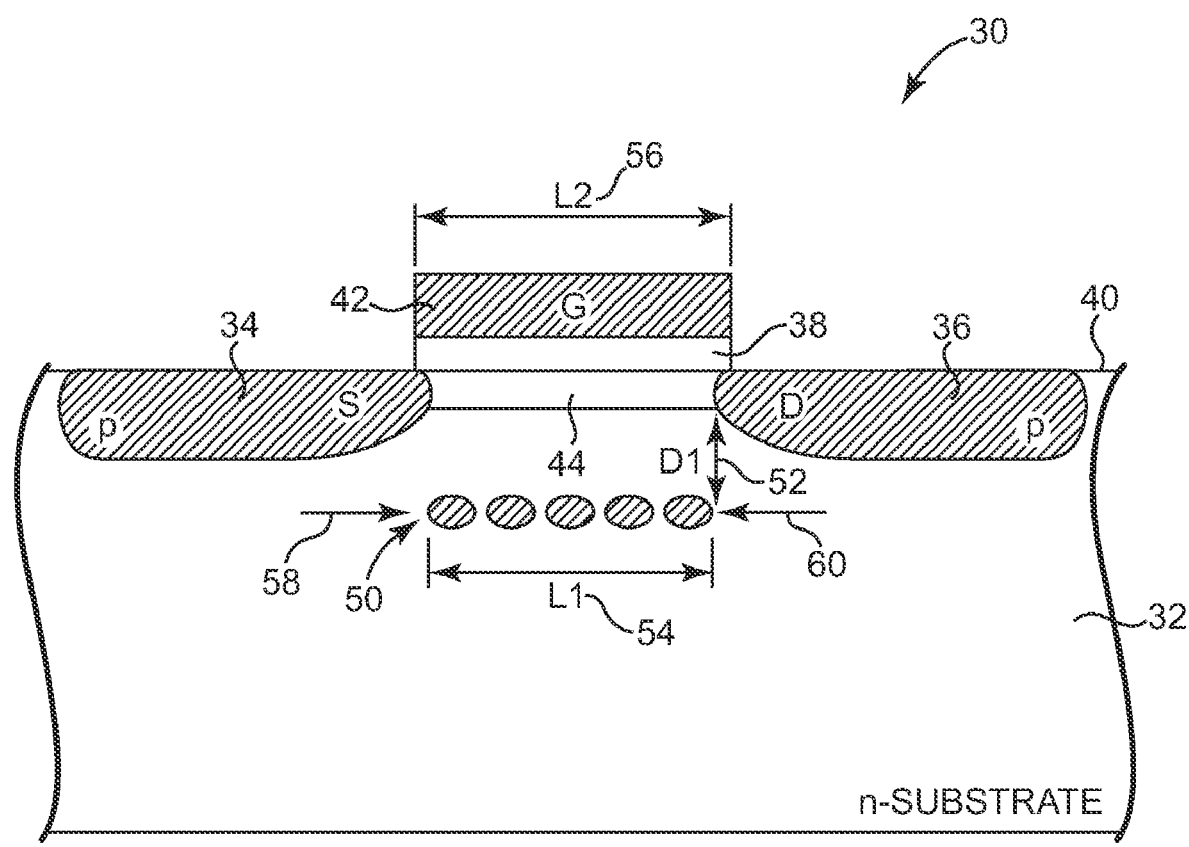
FIG. 1 is a cross-sectional view illustrating a PMOS transistor according to one embodiment.

FIG. 1 is a cross-sectional view illustrating generally a pMOSFET (PMOS) transistor 30, according to one embodiment. PMOS transistor 30 includes a substrate 32 of an n-type conductivity, a source region 34 having a p-type conductivity, a drain 36 having a p-type conductivity, an insulating layer 38 (e.g. silicon-oxide (SiO2)) positioned on a surface 40 of substrate 32 between source and drain regions 34 and 36, and a gate 42 (e.g. polysilicon) positioned on top of insulating layer 38. A p-type channel region 44 is induced between source and drain regions 34 and 36 when source region 34, drain region 36, and gate 42 are properly biased.

According to one embodiment, PMOS transistor 30 further includes a region or band 50 of silicon-carbide (SiC) precipitates disposed at a desired distance (D1) 52 below p-type channel region 44 and essentially between source and drain regions 34 and 36. In one embodiment, SiC band 50 has a length (L1) 54 which is substantially equal to a length (L2) 56 of gate 42. As will be described in greater detail below, the lattice structure of SiC band 50 has an average lattice constant smaller than the average lattice constant of the surrounding silicon substrate 32 such that SiC band 50 produces compressive forces on channel region 44, as indicated by arrows 58 and 60. These compressive forces, in turn, increase hole mobility in channel region 44 and thereby improve the performance of PMOS transistor 30.

Figure 2:
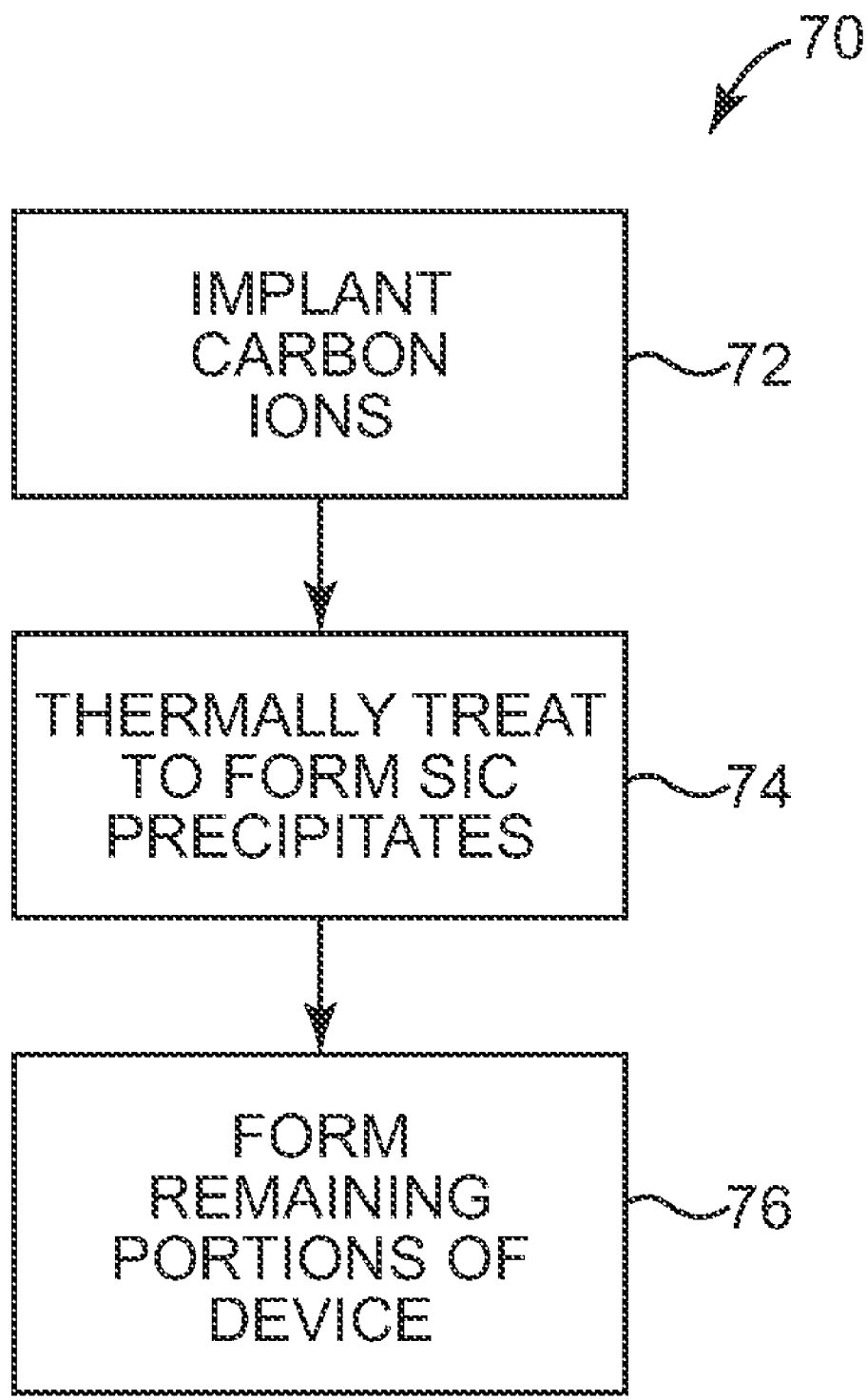
FIG. 2 is flow diagram generally illustrating a semiconductor fabrication process according to one embodiment.
Figure 3:
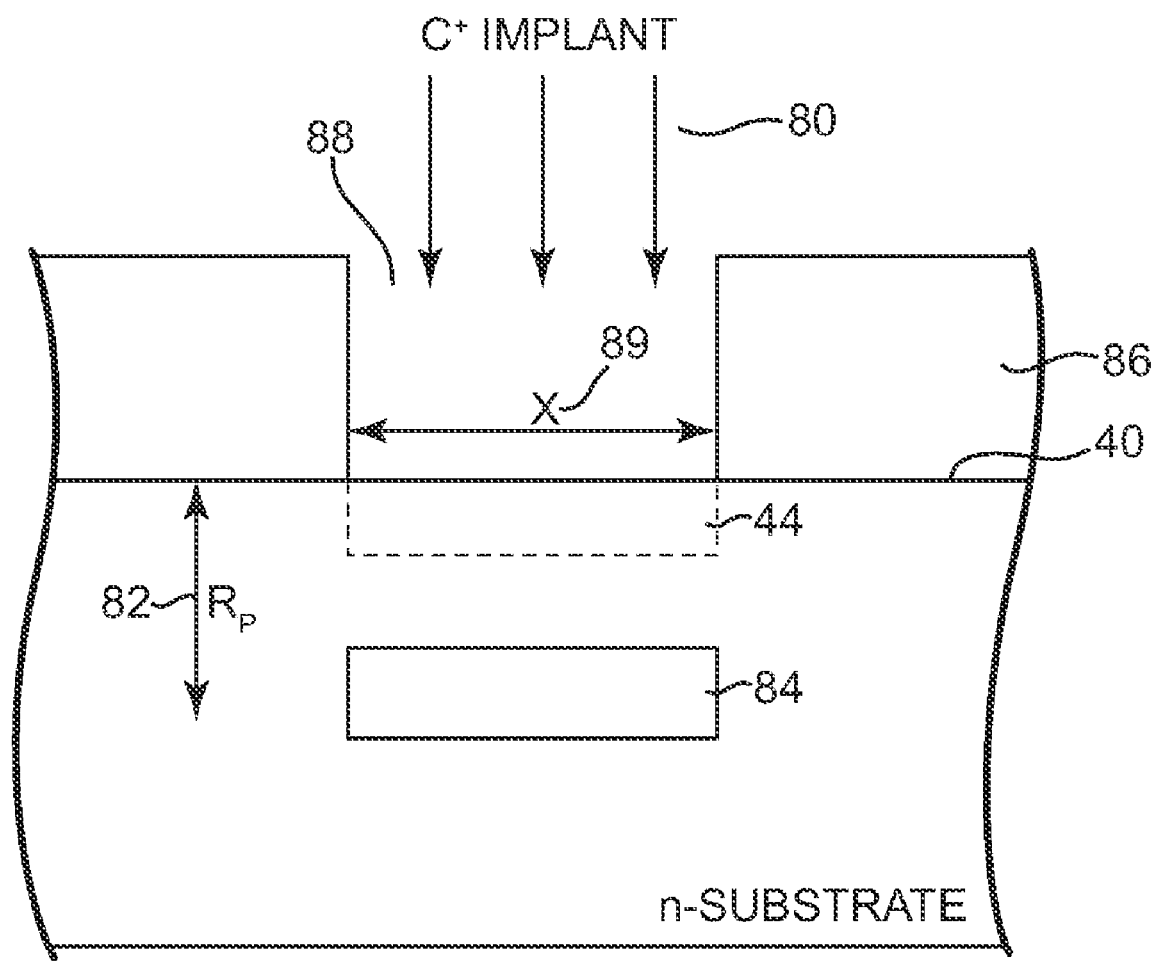
FIG. 3 is a block diagram generally illustrating an ion implantation process according to one embodiment employed by the fabrication process of FIG. 2.
Figure 4:
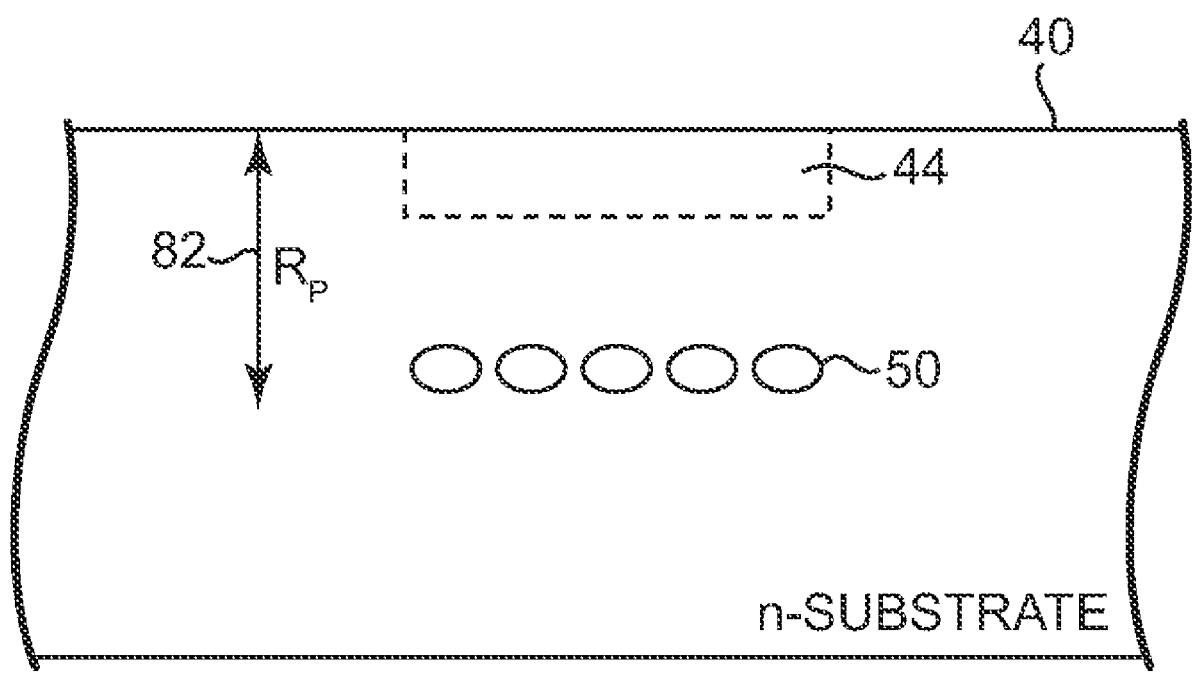
FIG. 4 is a block diagram generally illustrating a band of SiC precipitates formed as part of the fabrication process of FIG. 2.
Figure 5:
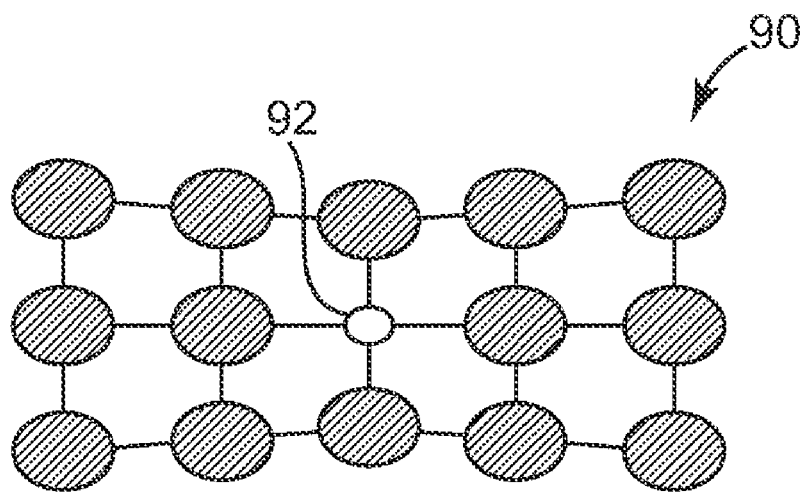
FIG. 5 is a schematic diagram illustrating generally an example of an SiC lattice structure.

FIG. 2 is flow diagram illustrating one embodiment of a process 70 for forming PMOS transistor 30, with further reference being made to FIGS. 3 through 5. Process 70 begins at 72 with the implantation of a high dose of carbon ions (C+) into substrate 32. With reference to FIG. 3, the high dose of carbon ions (C+), as indicated at 80, are implanted to a projected range (Rp) 82 into substrate from surface 40 and below a region which, after subsequent formation of source and drain regions 34 and 36, will become channel region 44 of PMOS transistor 30 (as indicated by the dashed lines). The implantation of C+ ions 80 forms a carbon-rich region 84.

As illustrated in FIG. 3, a mask 86 is employed to confine lateral extension of carbon-rich region 84 to approximately length L2 56 of gate 42 (see FIG. 1). As such, in one embodiment, a mask opening 88 in mask 86 has a width "x" 89 similar to length L2 56 of gate 42. However, the width "x" 89 may vary depending on the characteristics (e.g. gate length, depth of channel) of the particular PMOS device being fabricated. In one embodiment, mask 86 comprises a hard mask (e.g. oxide and nitride), for example.

The projected range Rp 82 is controlled by the implant energy employed during the implantation process and may vary depending on the characteristics of the particular PMOS device being fabricated. For small depth values of Rp 82, a stressed region resulting from the band of SiC precipitates 50, as will be described in greater detail below, may overlap source and drain regions 34 and 36 and cause leakage currents to occur. Additionally, if the band of SiC precipitates 50 is too close to channel region 44, it may affect the recombination of electron holes and thereby have detrimentally effect the performance of the PMOS device. However, for large depth values of Rp 82, the amount of stress produced in channel region 44 is decreased relative to small depth values of Rp 82. In general, with reference to FIG. 1, the implant energy is controlled so that projected range Rp 82 is such that the band of SiC precipitates 50 produced from carbon-rich region 84 is at desired distance (D1) 52 which ranges from 20 to 40 nanometers below channel region 44.

Two prerequisites are necessary for SiC precipitation to occur, the first being a high carbon concentration (i.e. carbon-rich region 84), and the second being a high interstitial concentration. The solid solubility of carbon ($C_S$) has been experimentally measured by IR spectroscopy as approximately $3.9 \times 10^{24} \exp(-2.3 \text{ eV}/kBT) \text{ cm}^{-3}$. For example, at 900° C., $C_S$ is approximately equal to 1 e15/cm3. Above solubility, carbon precipitates mainly into an SiC phase.

As such, during the implantation stage, as described above at 72, a high dose of C+ ions 80 is implanted. If too low a dose is employed, the SiC phase will not be achieved in a high enough density to adequately enhance the stress of the channel region. However, if too large a dose is employed, too high a density of SiC precipitates may be obtained resulting in their relaxing and a loss of the desired stress in the channel region. In one embodiment, the implantation dose of C+ ions 80 ranges between $1 \times 10^{15}$ and $1 \times 10^{17}$ per cm$^2$.

During the implantation process, the C+ ions 80 collide with and displace silicon atoms of substrate 32 to create a large number of interstitials and vacancies within the lattice of substrate 32. It is noted that during the implantation process, due to the high implantation energy, a quantity of vacancies and interstitials larger than the number of C+ ion 80 implanted are created. However, due to the recombination effects of vacancies and interstitials, the majority of the interstitial vacancies are suppressed, and only an amount interstitials approximately equal to the dose of implanted C+ ions 80 remain.

Returning to FIG. 2, after implanting C+ ions 80 into substrate 32 to form carbon-rich region 84, process 70 proceeds to 74, where an annealing process is performed to create the SiC phase and form the band of SiC precipitates 50 from the carbon atoms of the carbon-rich region 84 and to cause the interstitials to move toward the surface. It is noted that since C+ ions 80 are not dopants, and if the carbon-rich region 84 is adequately removed from channel region 44, the implanting of C+ ions 80 will not adversely impact the electrical characteristics of the PMOS device, such as PMOS transistor 30.

For the annealing process to be successful, the temperature must be at a level high enough and for a duration long enough to create the SiC precipitates, with the duration of the annealing process depending on the concentration of implanted carbon. In one embodiment, the annealing process is carried at a temperature ranging between 600 and 1300° C. In one embodiment, the duration varies in a range between 10 minutes and several hours. In one embodiment, the annealing process is performed at a temperature of 900° C. for a duration of 10 minutes.

FIG. 4 is a block diagram illustrating the band of SiC precipitates 50 resulting from carbon-rich region 84 after removal of mask 86 and the relatively low-temperature annealing process, as described above.

Figure 6:
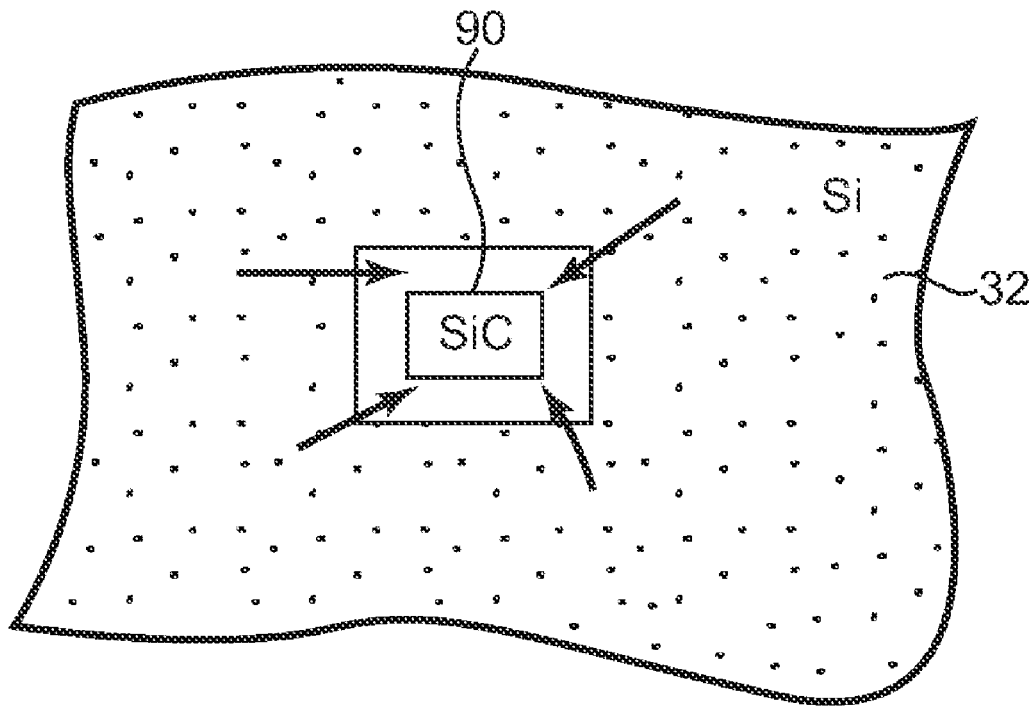
FIG. 6 is a schematic diagram representing the compressive strain in silicon substrate resulting from formation of an SiC structure.

FIGS. 5 and 6 represent the volume changes in the lattice of substrate 32 resulting from the formation of the SiC precipitates and due to the smaller average lattice constant of the SiC precipitates relative to the surrounding silicon lattice structure. FIG. 5 is a schematic diagram representing the SiC lattice structure 90, wherein, as a result of the annealing process, a carbon atom 92 has replaced an Si atom within lattice structure of substrate 32. Due to the smaller atomic radius of carbon, the precipitation of SiC involves a contraction in the volume of lattice structure 90 by a factor of about 2 relative to the unaffected silicon lattice structure of substrate 32, as illustrated by FIG. 6. It is this contraction, due to the smaller average lattice constant of the SiC structure relative to the surrounding silicon substrate, that creates the compressive forces 58 and 60 or compressive stress fields near channel region 44 (see FIG. 1).

Returning to FIG. 2, after the annealing process at 74, process 70 proceeds to 76 where the remaining portions of the PMOS transistor 30 are formed including source and drain regions 34 and 36, and oxide layer 40 and gate 42. These remaining portions of PMOS transistor 30 can be formed via conventional means, such as via diffusion techniques for source and drain regions 34 and 36, and deposition techniques for insulating layer 40 and gate 42, for example. It is noted that other conventional stress engineering processes, such as those described earlier, may also be applied so as to provide additional compressive strain within channel region 44 of PMOS transistor 30.

The above described implantation of C+ ions 80 and subsequent formation of the band of SiC precipitates 50 via the annealing process can be incorporated as part of the known CMOS fabrication processes, and enables the creation of compressive stress fields in channel region 44 in addition to those stress fields formed by implementation of nitride liners. Additionally, relative to eSi/Ge methods described earlier, the forming of a band of SiC precipitates according to embodiments described herein is less complex and less costly, and placement of the band of SiC precipitates below the channel region enables the formation of high compressive stress fields which are beneficial to hole mobility.

It is noted that although described above in terms of implanting silicon to form SiC precipitates, the techniques described herein with regard to creating compressive stress in the channel regions of a PMOS device can employ other non-dopant type materials whose resulting precipitates form a lattice structure having an average lattice structure which is smaller than that of silicon.

Additionally, although described above by FIGS. 1-6 primarily with regard to generating compressive stress in the channel region of a PMOS device, the teachings described herein can also be adapted to create tensile stresses in the channel regions of NMOS devices. To create such tensile stresses, a selected material (e.g. Germanium) is implanted at desired target depth below the surface of the silicon substrate and below a region which will become the channel region of the device. The selected material has properties such that after the annealing process is performed, the resulting band of precipitates formed from the selected material and the silicon of the substrate (e.g. SiGe) has an average lattice constant which is greater than that of the surrounding silicon. This resulting mismatch in average lattice constants produces a desired tensile stress in the channel region of the NMOS device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating a semiconductor device, the method comprising:
    implanting a selected material at a desired target depth below a surface of a silicon substrate and only below a region to be formed as a channel region;
    performing an annealing process to create a band of precipitates formed from the selected material and the silicon of the silicon substrate at the desired target depth;
    forming a source region and a drain region in the substrate so as to form the channel region there between and such that the band of precipitates is positioned below only the channel region, wherein the desired target depth is such that a desired separation distance is achieved between the channel region and the band of precipitates, and wherein an average lattice constant of the band of precipitates is different from the average lattice constant of the silicon substrate so as to cause a stress in the channel region.

2. The method of claim 1, wherein the selected material comprises a non-dopant material.

3. The method of claim 1, wherein the selected material has properties such that the band of precipitates formed by the selected material and the silicon has an average lattice constant which is less than the average lattice constant of the silicon substrate so that the stress in the channel region comprises a compressive stress.

4. The method of claim 3, wherein the selected material comprises carbon such that the band of precipitates comprises a band of silicon-carbide precipitates.

5. The method of claim 1, wherein the selected material has properties such that the band of precipitates formed the selected material and the silicon has an average lattice constant which is greater than the average lattice constant of the silicon substrate so that the stress in the channel region comprises a tensile stress.

* * * * *